(12) United States Patent
Park et al.

(10) Patent No.: US 12,381,080 B2
(45) Date of Patent: Aug. 5, 2025

(54) METHODS OF FORMING PATTERNS USING HARD MASK

(71) Applicant: SK hynix Inc., Icheon (KR)

(72) Inventors: Joo Hwan Park, Icheon (KR); Joon Gi Kwon, Icheon (KR); Myung Ok Kim, Icheon (KR)

(73) Assignee: SK hynix Inc., Icheon (KR)

( * ) Notice: Subject to any disclaimer, the term of this patent is extended or adjusted under 35 U.S.C. 154(b) by 269 days.

(21) Appl. No.: 18/052,813

(22) Filed: Nov. 4, 2022

(65) Prior Publication Data

US 2023/0386836 A1    Nov. 30, 2023

(30) Foreign Application Priority Data

May 27, 2022    (KR) .................... 10-2022-0065690

(51) Int. Cl.
*H01L 21/027* (2006.01)
*H01L 21/02* (2006.01)
*H01L 21/033* (2006.01)
*H01L 21/311* (2006.01)
*H01L 21/3213* (2006.01)

(52) U.S. Cl.
CPC .... *H01L 21/0274* (2013.01); *H01L 21/02115* (2013.01); *H01L 21/0332* (2013.01); *H01L 21/31144* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 7,867,911 B2* | 1/2011 | Nam | H01L 21/0332 438/585 |
| 9,536,987 B2 | 1/2017 | Yi et al. | |
| 9,738,765 B2* | 8/2017 | Brink | B05D 1/185 |
| 2009/0170325 A1* | 7/2009 | Jung | H01L 21/0334 438/694 |
| 2018/0211870 A1* | 7/2018 | Chae | H01L 21/76808 |
| 2018/0337046 A1* | 11/2018 | Shamma | H01L 21/0335 |
| 2019/0172717 A1* | 6/2019 | Ko | G03F 7/70033 |
| 2020/0199288 A1* | 6/2020 | Jung | G03F 7/094 |
| 2021/0183656 A1* | 6/2021 | Lutker-Lee | H01L 21/0337 |

FOREIGN PATENT DOCUMENTS

KR    101055962 B1    8/2011

* cited by examiner

*Primary Examiner* — Shamim Ahmed

(57) ABSTRACT

A method of forming patterns includes: forming a hard mask layer on a target layer, coating a cleavage relief layer on the hard mask layer to fill cleavages generated in the hard mask layer, forming photoresist patterns on the cleavage relief layer, removing portions of the cleavage relief layer and portions of the hard mask layer using the photoresist patterns as a first etch mask to form hard mask patterns, removing portions of the target layer using the hard mask patterns as a second etch mask to form target layer patterns, and removing the hard mask patterns. The hard mask layer includes an amorphous carbon layer (ACL), and the cleavage relief layer includes a spin-on carbon (SOC) layer.

20 Claims, 9 Drawing Sheets

METHODS OF FORMING PATTERNS USING HARD MASK

CROSS-REFERENCE TO RELATED APPLICATION

The present application claims priority under 35 U.S.C. 119(a) to Korean Application No. 10-2022-0065690, filed on May 27, 2022, which is incorporated herein by reference in its entirety.

BACKGROUND

1. Technical Field

Embodiments of the present disclosure generally relate to an integrated circuit device manufacturing technology and, more particularly, to a method of forming patterns using a hard mask.

2. Related Art

Integrated circuits may be manufactured as semiconductor devices by applying a semiconductor process technology. A target layer may be formed on a semiconductor substrate, and the target layer may be patterned through a photolithography process, thereby forming target layer patterns that constitute the integrated circuit device. As the integrated circuit devices are down-scaled, the size or critical dimension (CD) of the target layer patterns constituting the integrated circuit device has been gradually decreased. Accordingly, it is becoming difficult to selectively etch the target layer only using the photoresist pattern formed by the photolithography process. To improve the selective etching process, a hard mask structure has been additionally introduced between the target layer and the photoresist pattern.

SUMMARY

An aspect of the present disclosure may present a method of forming patterns, including forming a hard mask layer on a target layer, coating a cleavage relief layer on the hard mask layer to fill cleavages generated in the hard mask layer, forming photoresist patterns on the cleavage relief layer, removing portions of the cleavage relief layer and portions of the hard mask layer using the photoresist patterns as a first etch mask to form hard mask patterns, removing portions of the target layer using the hard mask patterns as a second etch mask to form target layer patterns, and removing the hard mask patterns.

Another aspect of the present disclosure may present a method of forming patterns, including forming a lower structure layer that provides an alignment key, forming a target layer on the lower structure layer, the target layer including a step difference portion generated by the alignment key, forming a hard mask layer including an amorphous carbon layer (ACL) on the target layer, forming a cleavage relief layer including a spin-on carbon (SOC) layer on the hard mask layer, the cleavage relief layer being formed to fill cleavages caused in the hard mask layer by the step difference portion, forming photoresist patterns on the cleavage relief layer, removing portions of the cleavage relief layer and portions of the hard mask layer using the photoresist patterns as a first etch mask to form hard mask patterns, removing portions of the target layer using the hard mask patterns as a second etch mask to form target layer patterns, and removing the hard mask patterns.

Another aspect of the present disclosure may present a method of forming patterns, including depositing a hard mask layer on a target layer, the hard mask layer including an amorphous carbon layer (ACL), forming a cleavage relief layer including a spin-on carbon (SOC) layer to fill cleavages caused in the hard mask layer, removing portions of the target layer using the hard mask layer and the cleavage relief layer, and removing the hard mask layer and the cleavage relief layer together.

DETAILED DESCRIPTION

Figure 1:
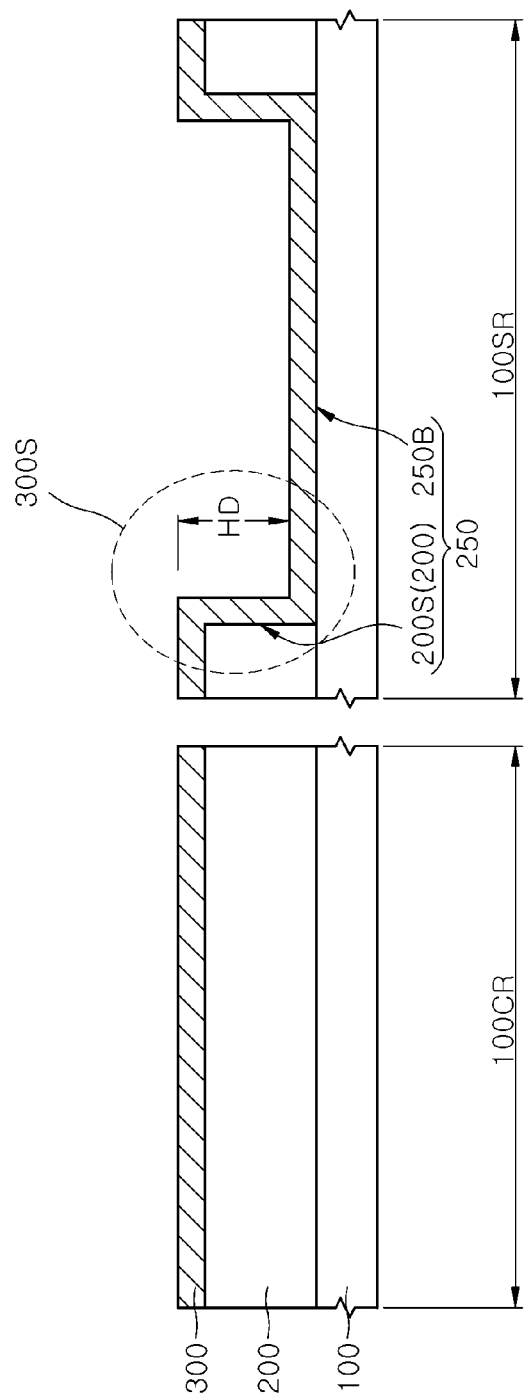
FIG. 1 is a schematic cross-sectional view in which a target layer is formed by a method of forming patterns according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various devices, these devices should not be limited by these terms. These terms are only used to distinguish one device from another device, but not used to indicate a particular sequence or number of devices. These terms refer to relative positional relationships, and do not limit specific cases in which another member is introduced in direct contact with the member or at an interface therebetween. The same interpretation may be applied to other expressions describing the relationship between components. For example, the term "on" may be used to describe positional relationship of two layers when these two layers are in direct contact with each other or one or more intervening layers are disposed between the two layers.

Embodiments of the present disclosure may be applied to a technical field implementing integrated circuit devices such as dynamic random access memory (DRAM) devices, phase change random access memory (PcRAM) devices, or resistive random access memory (ReRAM) devices. In addition, the embodiments of the present disclosure may be applied to a technical field for implementing memory devices such as static random access memory (SRAM) devices, NAND-type flash memory devices, NOR-type flash memory devices, magnetic random access memory (MRAM) devices, or ferroelectric random access memory (FeRAM) devices, or logic devices in which logic circuits are integrated. The embodiments of the present disclosure may be applied to a technical field for implementing various products requiring fine-sized patterns.

Same reference numerals may refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIGS. 1 to 9 are schematic views illustrating a method of forming patterns according to an embodiment of the present disclosure. FIG. 1 is a schematic cross-sectional view in which a target layer 300 is formed by the method of forming patterns according to an embodiment of the present disclosure.

Referring to FIG. 1, the target layer 300 may be formed on a substrate 100. The substrate 100 may include a semiconductor material. The substrate 100 may include a semiconductor material such as silicon (Si) or germanium (Ge). The substrate 100 may include a compound semiconductor material such as silicon carbide (SiC), gallium arsenide (GaAs), indium arsenide (InAs), or indium phosphorus (InP). The substrate 100 may have a wafer feature.

The substrate 100 may include first regions 100CR and a second region 100SR. The first regions 100CR of the substrate 100 may be chip regions in which integrated circuit devices are disposed. The second region 100SR of the substrate 100 may be a scribe lane region between the chip regions. Each of the first regions 100CR of the substrate 100 may be a region having a relatively high pattern density, and the second region 100SR of the substrate 100 may be a region having a relatively low pattern density. The integrated circuit devices may include semiconductor devices or memory devices. The integrated circuits may be volatile memory devices such as dynamic random access memory (DRAM) devices. The integrated circuit devices may be nonvolatile memory devices such as flash memory devices.

Although not illustrated, electronic elements constituting the integrated circuit devices may be formed in the first regions 1000CR of the substrate 100. Although not illustrated, gate structures constituting transistor structures may be formed in the first regions 100CR of the substrate 100. Although not illustrated, a plurality of word line trenches may be formed in the first regions 100CR of the substrate 100, a gate dielectric layer may be formed, and a plurality of word lines may be formed, thereby configuring gate structures. The gate structures may be formed as buried gate structures. Although not illustrated, a plurality of conductive plugs or a plurality of conductive contacts may be formed between the gate structures in the first region 100CR of the substrate 100. The conductive plugs or the conductive contacts may be formed as elements that are electrically connected to bit lines.

A lower structure layer 200 may be further formed on the substrate 100 as an underlying layer of the target layer 300. Although not illustrated in detail, the lower structure layer 200 may include an insulating layer, a conductive layer, or a combination thereof. The lower structure layer 200 may include interconnection layers including a metal layer and insulating layers for insulating the interconnection layers from each other. Although not illustrated in detail, the lower structure layer 200 may include bit line structures on the first regions 100CR of the substrate 100. Although not illustrated in detail, the lower structure layer 200 may further include another plurality of conductive plugs or another plurality of conductive contacts between the bit line structures. The conductive plugs or the conductive contacts of the lower structure layer 200 may be formed as elements that electrically connect capacitor structures to transistor structures formed on the substrate 100.

The lower structure layer 200 may be formed on the first regions 100CR of the substrate 100, and may extend on the second region 100SR of the substrate 100. The lower structure layer 200 may be formed to provide an alignment key 250 on the second region 100SR of the substrate 100.

Figure 2:
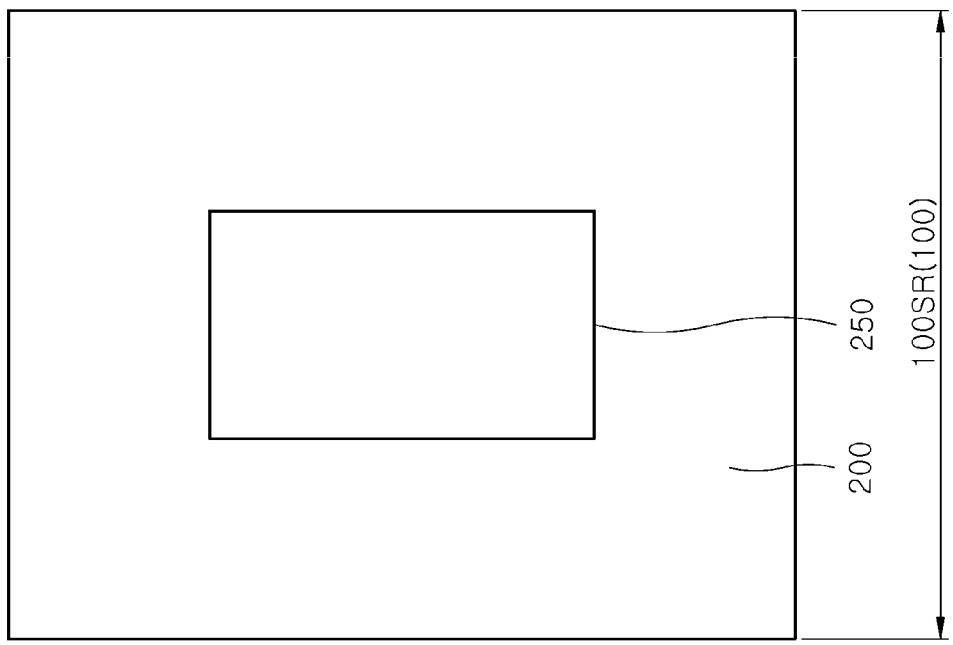
FIG. 2 is a schematic plan view illustrating an alignment key shown in FIG. 1 according to an embodiment.

FIG. 2 is a schematic plan view illustrating the alignment key 250 shown FIG. 1 according to an embodiment.

Referring to FIGS. 1 and 2, the alignment key 250 may be formed by recessing a portion of the lower structure layer 200 of the second region 100SR of the substrate 100. The alignment key 250 may have a box feature when viewed in a plan view. Although the alignment key 250 is presented as having a box feature in FIG. 2, the alignment key 250 may be modified to have various planar features. Although the alignment key 250 is presented as having a single box feature in FIG. 2, the alignment key 250 may be modified to have a feature of a plurality of recessed boxes. Although the alignment key 250 is presented in FIG. 2 as having a feature in which a portion of the lower structure layer 200 is recessed to expose the underlying substrate 100, the lower structure layer 200 may be formed in a feature in which a certain thickness remains on the bottom of the recessed box. Alternatively, the alignment key 250 may be formed to further recess a portion of the substrate 100 under the lower structure layer 200.

The lower structure layer 200 may be formed to have a thickness of approximately 140 nanometers (nm) to 200 nanometers (nm). Because a portion of the lower structure layer 200 is recessed to form the alignment key 250, the alignment key 250 may have a depth of approximately 140 nm to 200 nm.

Referring to FIG. 1 again, the target layer 300 may be formed on the lower structure layer 200. The target layer 300 may be formed to extend to cover the lower structure layer 200 and to cover the alignment key 250. The alignment key 250 may include a recessed side surface 200S and a recessed bottom surface 250B of the lower structure layer 200. The target layer 300 may be formed to cover the recessed side surface 200S and to cover the recessed bottom surface 250B of the lower structure layer 200. Because the target layer 300 extends to conformally cover the underlying alignment key 250, the target layer 300 may be formed while generating a step difference portion 300S over the second region 100SR of the substrate 100 due to the lower alignment key 250. Due to the topology of the underlying alignment key 250, the step difference portion 300S may be generated in the target layer 300 that covers the alignment key 250. The step difference portion 300S may indicate a portion in which a surface height difference HD is generated. Here, the surface height difference HD may refer to the difference in height from the substrate 100 to the surface of the target layer 300. In the embodiment shown in FIG. 1, the surface height difference HD may refer to the difference in height between a top surface of a first portion of the target layer 300 and a top surface of a second portion of the target layer 300, the first portion being disposed on the lower structure layer 200 and the second portion being disposed on the substrate 100.

The target layer 300 may be formed as a layer for providing target layer patterns to be disposed in the first regions 100CR of the substrate 100. The target layer 300 may be formed as a layer to be subjected to a selective etching process, a selective removal process, or a patterning process in the subsequent selective etching process. The target layer 300 may be formed to have a thinner thickness than the lower structure layer 200. The target layer 300 may include a metal layer or a conductive layer. The target layer 300 may include a tungsten (W) layer. In an embodiment, a ratio of a thickness of the target layer 300 over a thickness of the lower structure layer 200 may be in a range from about 10% to about 30%. For example, the target layer 300 may have a thickness of approximately 20 nm to 40 nm. The tungsten (W) layer may be formed to have a thickness of approximately 35 nm. The target layer 300 may be formed by depositing tungsten (W) to form a tungsten (W) layer and planarizing the tungsten (W) layer by performing a planarization process such as chemical mechanical polishing (CMP).

Figure 3:
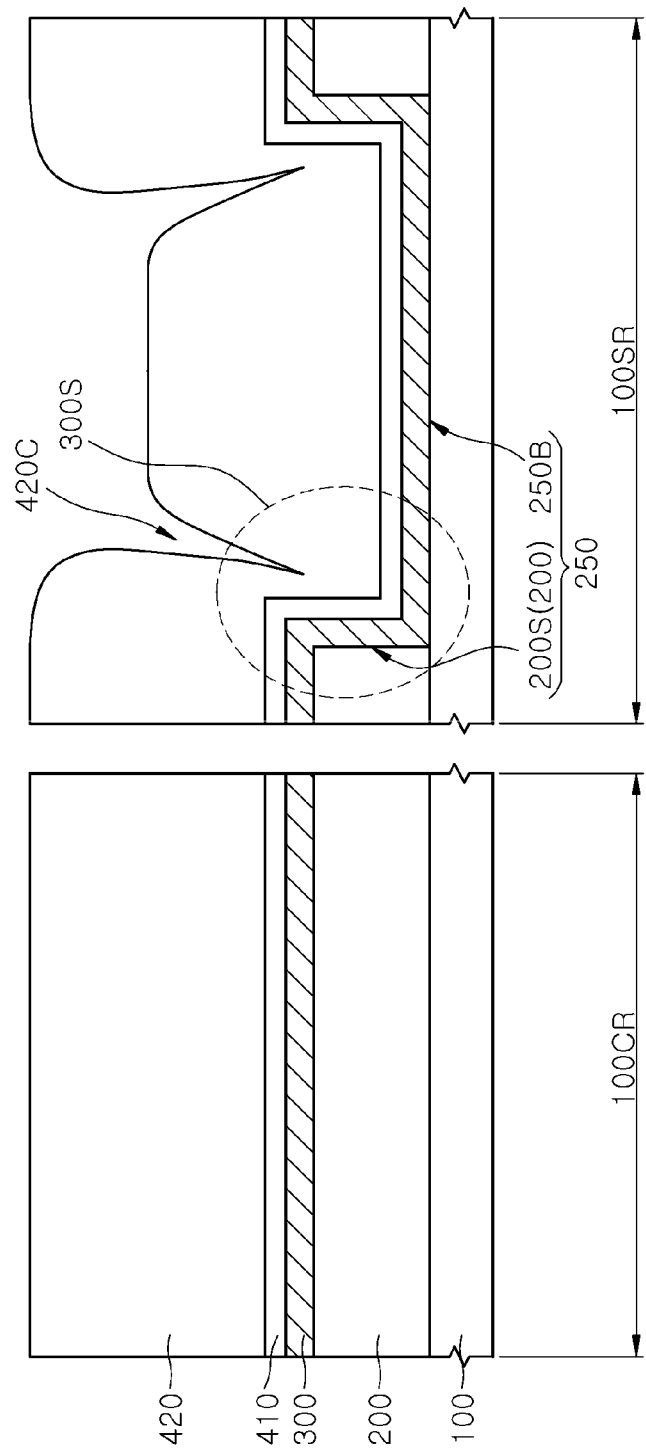
FIG. 3 is a schematic cross-sectional view in which a hard mask is formed by the method of forming patterns, according to an embodiment of the present disclosure.

FIG. 3 is a schematic cross-sectional view in which a hard mask layer 420 is formed by the method of forming patterns, according to an embodiment of the present disclosure.

Referring to FIG. 3, the hard mask layer 420 may be formed over the target layer 300. A lower layer 410 of a material different from the material of the hard mask layer 420 may be further formed between the hard mask layer 420 and the target layer 300. The lower layer 410 may include silicon nitride ($Si_3N_4$). When the target layer 300 includes a conductive layer or a metal layer, the lower layer 410 may include an insulating layer that covers and insulates the conductive layer or the metal layer. The lower layer 410 may be formed as a protecting layer or a capping layer that covers the conductive layer or the metal layer of the target layer 300 and protects the conductive layer or the metal layer from the hard mask material constituting the hard mask layer 420. The lower layer 410 may be formed as a layer that separates the hard mask layer 420 and the target layer 300 from each other. The lower layer 410 may have a thickness similar to that of the target layer 300. The lower layer 410 may have a thinner thickness than the hard mask layer 420. The lower layer 410 may be thicker than the target layer 300 and may be thinner than the hard mask layer 420. The lower layer 410 may have a thickness of approximately 20 nm.

The hard mask layer 420 may include a layer of a different material from the material constituting the lower layer 410. The hard mask layer 420 may be formed as a layer including carbon (C) as a component. The hard mask layer 420 may be formed by depositing a hard mask material on the target layer 300 or on the lower layer 410. The hard mask layer 420 formed by depositing the hard mask material may be formed as a carbon layer having carbon (C) as a main component. The hard mask layer 420 may be formed through a chemical vapor deposition (CVD) process. The hard mask layer 420 may include an amorphous carbon layer (ACL). The amorphous carbon layer (ACL) may include a layer formed by depositing carbon (C) through the chemical vapor deposition (CVD) process.

In the first regions 100CR of the substrate 100, the hard mask layer 420 may be formed to have a substantially constant thickness with little variation in thickness according to positions. The hard mask layer 420 may be deposited to have a thickness that is greater than the thickness of the target layer 300. The hard mask layer 420 may be deposited to have a thickness that is similar to or thinner than the thickness of the lower structure layer 200. In an embodiment, a ratio of a thickness of the hard mask layer 420 over a thickness of the lower structure layer 200 may be in a range from about 50% to about 100%. In the first regions 100CR of the substrate 100, the hard mask layer 420 may be deposited to have a thickness of approximately 100 nm to 200 nm. In the first regions 100CR of the substrate 100, the hard mask layer 420 may be deposited to have a thickness of approximately 120 nm.

In the second region 100SR of the substrate 100, the thickness of the hard mask layer 420 may not be substantially constant and may be relatively thin depending on the positions. On the step difference portion 300S generated by the alignment key 250 and the periphery of the step difference portion 300S, the step coverage of the hard mask layer 420 may be deteriorated. Accordingly, on the step difference portion 300S and the periphery of the step difference portion 300S, a portion of the hard mask layer 420 may be deposited in a significantly thinner thickness than other portions. Accordingly, the portions of the hard mask layer 420 positioned near the step difference portion 300S may be deposited to exhibit cleavages (e.g., gaps) 420C. The cleavages 420C may indicate concave cracks. The cleavages 420C caused in some portions of the hard mask layer 420 may act as residue sources causing unwanted residues in the subsequent process of removing the hard mask layer 420. The generation of residues may be a factor that may cause failures in the integrated circuit devices.

Figure 4:
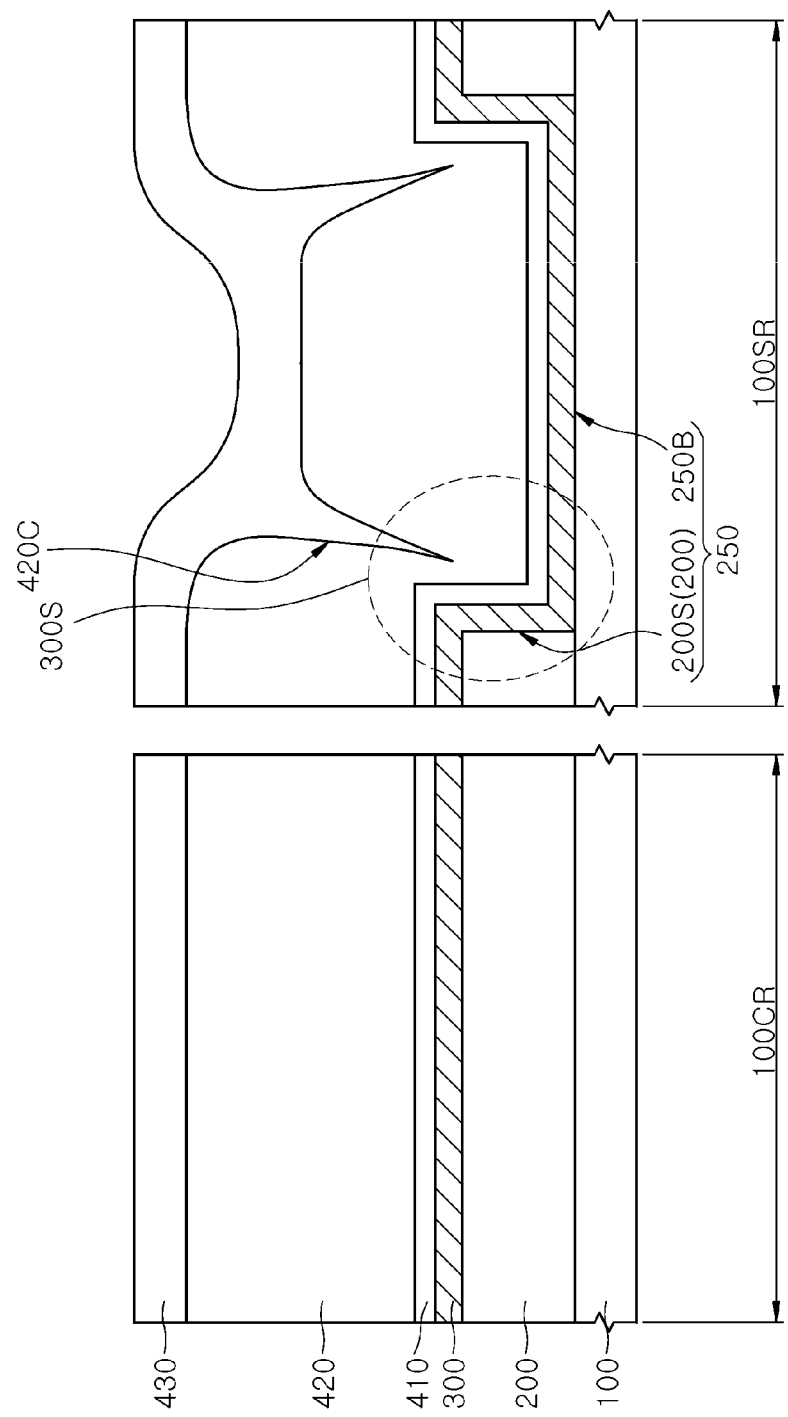
FIG. 4 is a schematic cross-sectional view in which a cleavage relief layer is formed by the method of forming patterns, according to an embodiment of the present disclosure.

FIG. 4 is a schematic cross-sectional view in which a cleavage relief layer (e.g., a gap relief layer) 430 is formed by the method of forming patterns, according to an embodiment of the present disclosure.

Referring to FIG. 4, the cleavage relief layer 430 may be formed on the hard mask layer 420. The cleavage relief layer 430 may be formed as a layer that fills the cleavages 420C caused in the hard mask layer 420. The cleavage relief layer 430 may relieve the step difference portion 300S and may fill the cleavages 420C to substantially prevent the materials constituting other layers from flowing in the cleavages 420C in the subsequent processes. The cleavage relief layer 430 may be formed through a spin coating process capable of filling the cleavages 420C. In an embodiment, the cleavage relief layer 430 may have flow properties (e.g., relatively low viscosity) sufficient to substantially entirely fill the cleavages 420C through the spin coating process.

The cleavage relief layer 430 may be formed as a layer including substantially the same component as the component constituting the hard mask layer 430 as a main component. The cleavage relief layer 430 may be formed in a carbon layer including a carbon component as the main component. The cleavage relief layer 430 may be formed to include a spin-on carbon (SOC) layer. While the amorphous carbon layer (ACL) of the hard mask layer 420 has a carbon content of substantially 100% or close to 100%, the spin-on carbon (SOC) layer of the cleavage relief layer 430 may have a relatively low carbon content than the amorphous carbon layer (ACL). Because the spin-on carbon (SOC)

layer contains binders, the spin-on carbon (SOC) layer may be formed to have a carbon content of approximately 90%. In an embodiment, the spin-on carbon (SOC) layer of the cleave relief layer 430 may have a carbon content in a range from 85 to 95%, 87% to 93%, 89% to 91%, or 89.5% to 90.5%.

The cleavage relief layer 430 may be formed to have a thickness that is thinner than that of the hard mask layer 420. The cleavage relief layer 430 may be formed to have a thickness that is sufficient to fill the cleavages 420C. In an embodiment, a ratio of a thickness of the cleavage relief layer 430 over a thickness of the hard mask layer 420 may be in a range from about 10% to about 40%. The cleavage relief layer 430 may be formed to have a thickness of approximately 20 nm to 40 nm. The cleavage relief layer 430 may be formed to have a thickness of approximately 30 nm.

Figure 5:
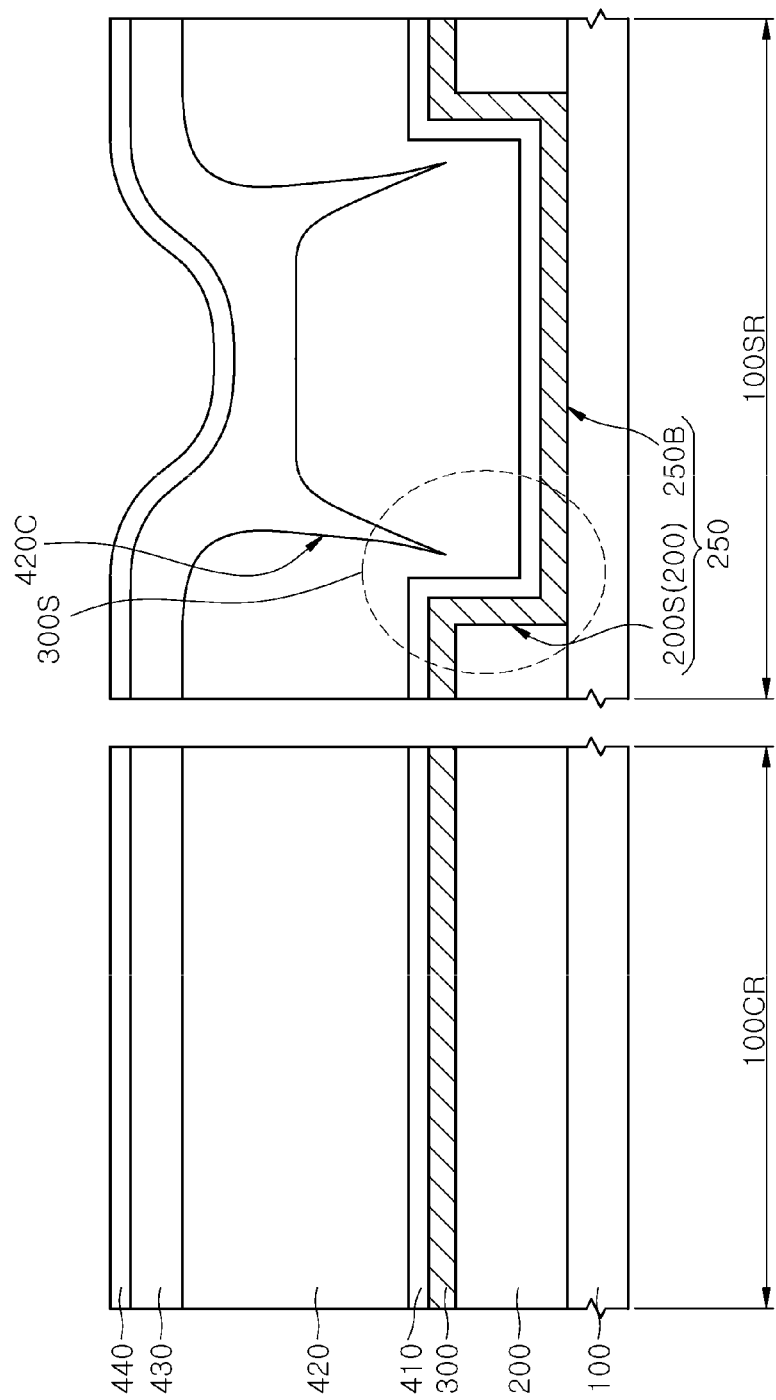
FIGS. 5 and 6 are schematic cross-sectional views in which photoresist patterns are formed by the method of forming patterns, according to an embodiment of the present disclosure.

FIG. 5 is a schematic cross-sectional view in which an upper layer 440 is formed by the method of forming patterns, according to an embodiment of the present disclosure.

Referring to FIG. 5, the upper layer 440 including a different material from the cleavage relief layer 430 may be formed on the cleavage relief layer 430. The upper layer 440 may be formed as a protecting layer that covers and protects the cleavage relief layer 430. The upper layer 440 may be formed as a protecting layer that protects the spin-on carbon (SOC) layer constituting the cleavage relief layer 430. The upper layer 440 may be formed in a material layer containing silicon (Si) and nitrogen (N), or further containing oxygen (O). The upper layer 440 may include a silicon oxynitride (SiON) layer. The upper layer 440 may have a thickness that is similar to or thinner than the thickness of the cleavage relief layer 430. The upper layer 440 may be formed to have a thickness of approximately 1 nm to 30 nm.

Figure 6:
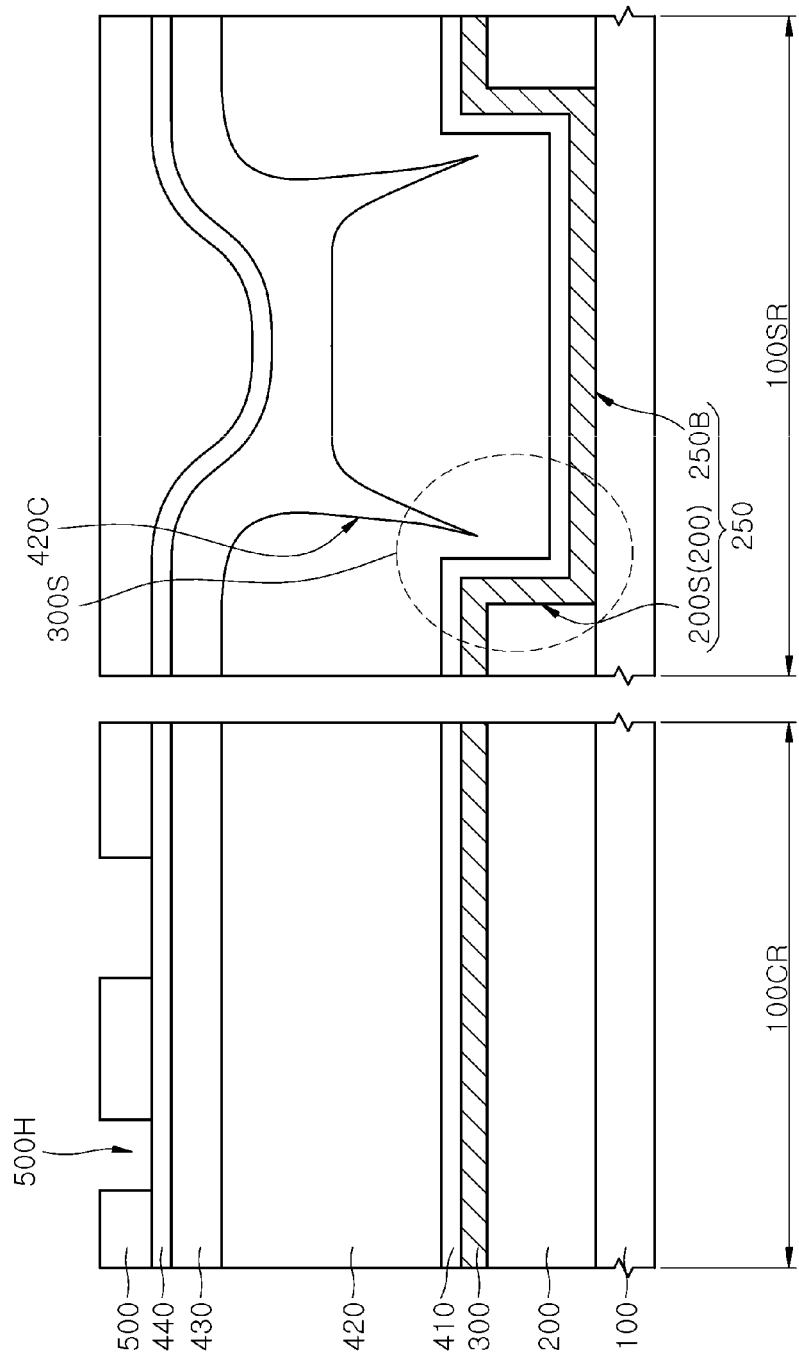

FIG. 6 is a schematic cross-sectional view in which photoresist patterns 500 are formed by the method of forming patterns, according to an embodiment of the present disclosure.

Referring to FIG. 6, the photoresist patterns 500 may be formed on the cleavage relief layer 430 through a photolithography process. A photoresist layer may be formed on the cleavage relief layer 430 and the upper layer 440. The upper layer 440 may serve to separate the cleavage relief layer 430 and the photoresist layer or the photoresist patterns 500 from each other.

The photoresist layer may include various kinds of photoresist materials. The photoresist material may include a resist material for extreme ultraviolet (EUV: 13.5 nm), a resist material for KrF excimer lasers (248 nm), a resist material for ArF excimer lasers (193 nm), or a resist material for F2 excimer lasers (157 nm). The photoresist layer may have a thickness of approximately 10 nm to 100 nm. The photoresist patterns 500 may be formed by exposing the photoresist layer and developing the exposed photoresist layer. The photoresist layer may be exposed using the extreme ultraviolet (EUV). For example, portions of the photoresist layer may be exposed using the EUV and the exposed portions of the photoresist layer may be developed to form the photoresist patterns 500.

First openings 500H may be formed between the photoresist patterns 500. Some portions of the upper layer 440 may be exposed to the first openings 500H that are provided by the photoresist patterns 500. The photoresist patterns 500 may be formed to have a feature in which the target layer 300 is to be patterned. In other words, the photoresist patterns 500 may be transferred into the target layer 300. Each of the photoresist patterns 500 may have an island feature (e.g., an island shape) or a line feature (e.g., a line shape). The photoresist patterns 500 may be formed as patterns that are spaced apart from each other and form a regular arrangement. The photoresist patterns 500 may be formed as patterns that are spaced apart from each other and form an irregular arrangement.

Figure 7:
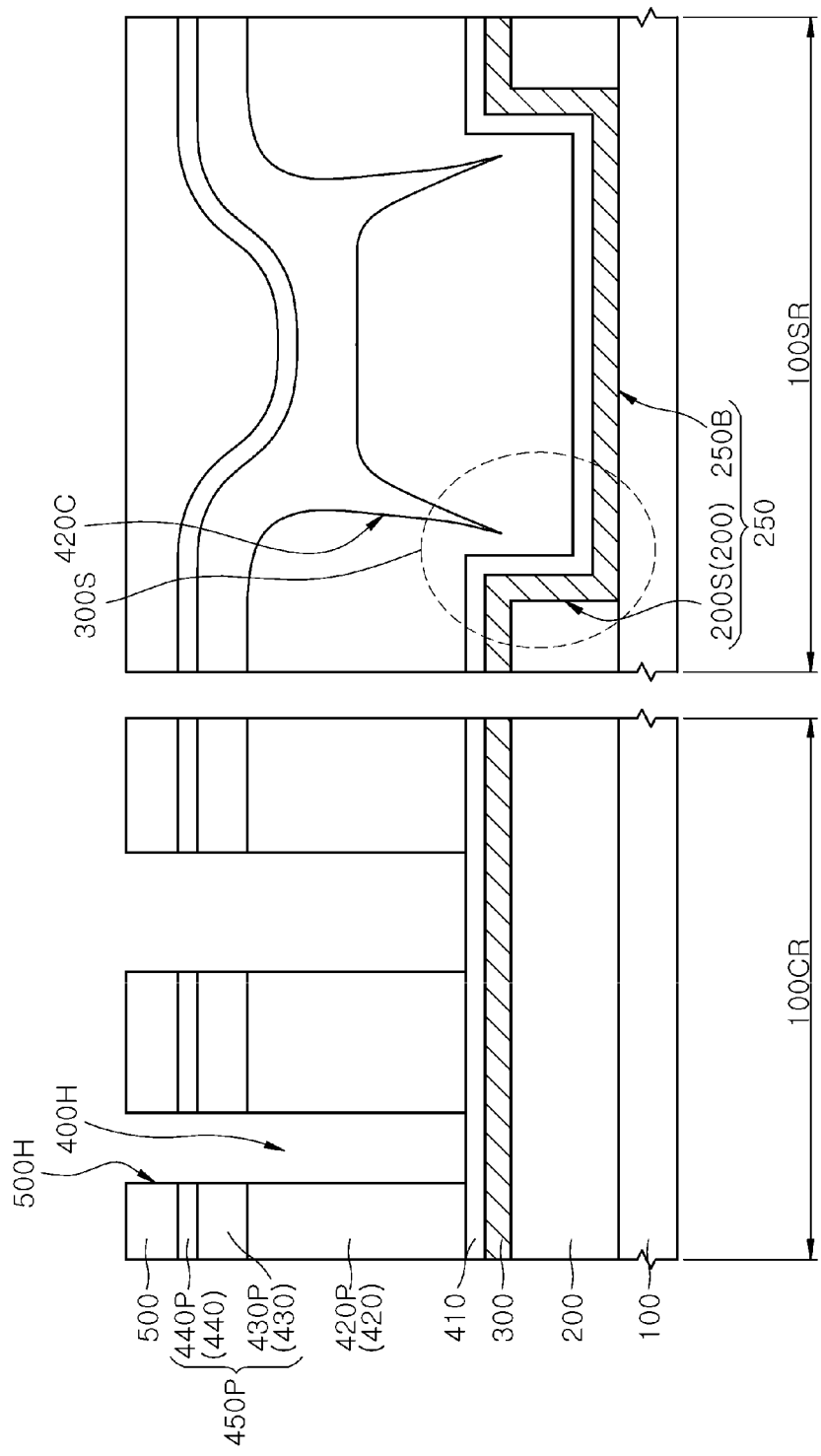
FIG. 7 is a schematic cross-sectional view in which hard mask patterns are formed by the method of forming patterns, according to an embodiment of the present disclosure.

FIG. 7 is a schematic cross-sectional view in which hard mask patterns 450P including hard mask layer patterns 420P and cleavage relief layer patterns (e.g., gap relief layer patterns) 430P are formed by the method of forming patterns according to the embodiment of the present disclosure.

Referring to FIG. 7, a pattern-transferring process of transferring the features of the photoresist patterns 500 to the target layer 300 may be performed. Specifically, a selective etching process may be performed using the photoresist patterns 500 as a first etch mask. The selective etching process using the photoresist patterns 500 as the first etch mask may include an anisotropic etching process. Some portions of the upper layer 440 exposed through the first openings 500H may be selectively etched and removed by using the photoresist patterns 500 as the first etch mask. Accordingly, upper layer patterns 440P in which the features of the photoresist patterns 500 are pattern-transferred may be formed.

Some portions of the cleavage relief layer 430 may be selectively etched and removed by using the photoresist patterns 500 as the first etch mask. The portions of the cleavage relief layer 430 that are exposed while the upper layer patterns 440P are patterned may be removed by continuous etching. Accordingly, cleavage relief layer patterns 430P in which the features of the photoresist patterns 500 are pattern-transferred may be formed.

Some portions of the hard mask layer 420 may be selectively etched and removed by using the photoresist patterns 500 as the first etch mask. The portions of the hard mask layer 420 that are exposed while the cleavage relief layer patterns 430P are patterned may be removed by continuous etching. Accordingly, hard mask layer patterns 420P in which the features of the photoresist patterns 500 are pattern-transferred may be formed. The hard mask layer patterns 420P and the cleavage relief layer patterns 430P may constitute the hard mask patterns 450P in which the features of the photoresist patterns 500 are pattern-transferred.

The structure in which the hard mask layer patterns 420P, the cleavage relief layer patterns 430P, and the upper layer patterns 440P are stacked may be formed as patterns providing the second openings 400H. Each of the second openings 400H may have a feature in which the first opening 500H extends. In this selective etching process, at least some portions of the photoresist patterns 500 may be consumed. Some portions of the photoresist patterns 500 may remain on the upper layer patterns 440P, or the hard mask patterns 450P, or both.

Figure 8:
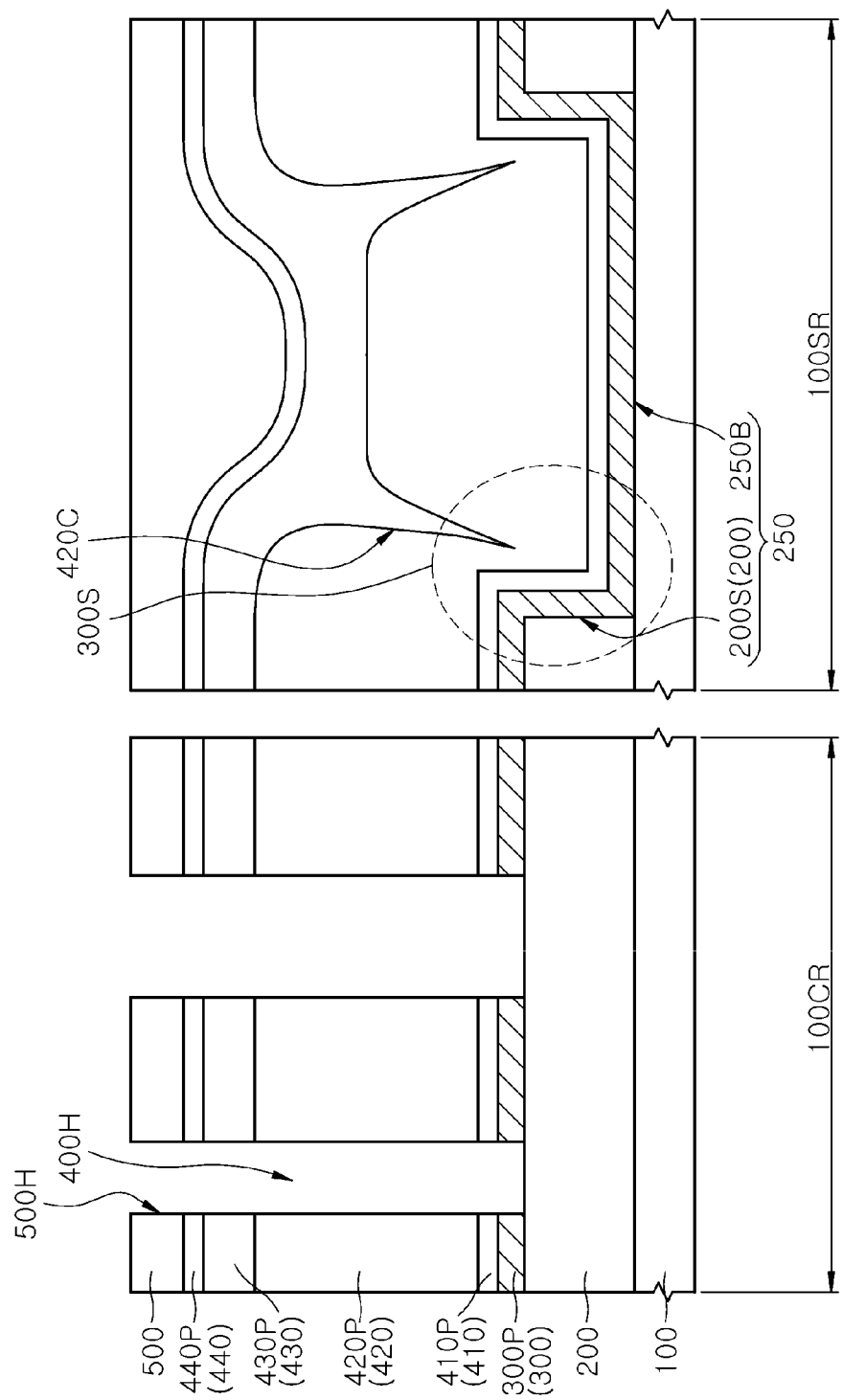
FIGS. 8 and 9 are schematic cross-sectional views in which target layer patterns are formed by the method of forming patterns, according to an embodiment of the present disclosure.

FIG. 8 is a schematic cross-sectional view in which target layer patterns 300P are formed by the method of forming patterns, according to an embodiment of the present disclosure.

Referring to FIG. 8, some portions of the target layer 300 may be removed by using the hard mask patterns 450P including the hard mask layer patterns 420P and the cleavage relief layer patterns 430P as a second etch mask to form the target layer patterns 300P. Accordingly, the features of the photoresist patterns 500 may be pattern-transferred to the target layer patterns 300P. Some portions of the lower layer 410 that are exposed to the second openings 400H may be selectively etched and removed by using the hard mask patterns 450P as the second etch mask. Accordingly, the features of the photoresist patterns 500 or the lower layer patterns 410P in which the hard mask patterns 420P and 430P are pattern-transferred may be formed. Some portions of the target layer 300 that are exposed while the lower layer patterns 410P are patterned may be etched and removed by continuous etching using the hard mask patterns 450P as the second etch mask. Accordingly, the target layer patterns 300P in which the features of the photoresist patterns 500 or the hard mask patterns 450P are pattern-transferred may be formed.

In these selective etching processes, at least some portions of the photoresist patterns 500 may be additionally consumed. Some portions of the photoresist patterns 500 may remain on the upper layer patterns 440P, or the hard mask patterns 450P, or both. The upper layer patterns 440P, or the hard mask patterns 450P, or both may also be partially consumed in the selective etching processes. After the selective etching processes, some portions of the hard mask patterns 450P may remain on the target layer patterns 300P, or the lower layer patterns 410P, or both.

Figure 9:
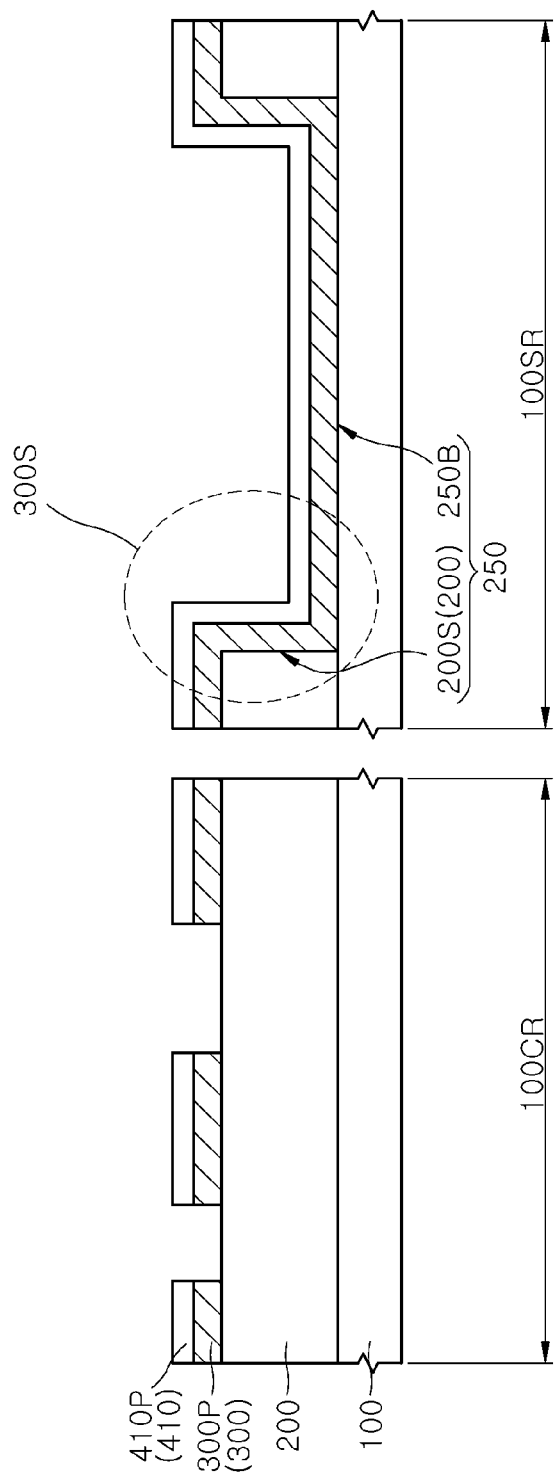

FIG. 9 is a schematic cross-sectional view in which the hard mask patterns 450P of FIG. 8 are removed by the method of forming patterns, according to an embodiment of the present disclosure.

Referring to FIGS. 8 and 9 together, after the target layer patterns 300P are patterned, the hard mask patterns 450P may be removed. The residues that may remain on the target layer patterns 300P may be removed. The portions of the hard mask patterns 450P may remain on the target layer patterns 300P, or on the lower layer patterns 410P, or both. The residues of the hard mask patterns 450P may be stripped and removed. Because the amorphous carbon layer (ACL) and spin-on carbon (SOC) layer constituting the hard mask patterns 450P are composed of carbon (C) as main components, the amorphous carbon layer (ACL) and the spin-on carbon (SOC) layer may be removed together through a removal process (e.g., an ashing process using an oxygen ($O_2$) plasma).

As presented in FIG. 8, because some portions of the spin-on carbon (SOC) layer of the cleavage relief layer 430 fills the cleavages 420C generated in the hard mask layer 420, the portions of the spin-on carbon (SOC) layer filling the cleavages 420C may also be removed while the amorphous carbon layer (ACL) of the hard mask layer 420 is removed. Accordingly, it is possible to reduce or prevent unwanted residues from remaining due to the cleavages 420C generated in the hard mask layer 420.

When the cleavage relief layer 430 is not introduced, other materials may flow into the cleavages 420C generated in the hard mask layer 420. The silicon oxynitride (SiON) constituting the upper layer 440 or the photoresist material may be introduced into the cleavages 420C generated in the hard mask layer 420. Alternatively, when a layer of polycrystalline silicon or a layer of silicon oxide may be introduced on the amorphous carbon layer (ACL), the polycrystalline silicon or silicon oxide may be introduced into the cleavages 420C. As such, the polycrystalline silicon, silicon oxide, or silicon oxynitride introduced into the cleavages 420C may remain without being removed when the amorphous carbon layer (ACL) is removed by ashing (e.g., plasma ashing).

Referring to FIG. 8 again, in the photolithography process for forming the photoresist patterns 500, the alignment key 250 may be used in the exposure process for exposing the photoresist layer such that the photoresist patterns 500 are aligned with the positions of the target layer patterns 300P. The alignment key 250 may be used to indicate where the target layer patterns 300P are to be positioned. The photoresist layer may be exposed and developed such that the photoresist patterns 500H are aligned with the positions of the target layer patterns 300P using the alignment key 250.

Referring to FIG. 8 again, according to the method of forming patterns, the hard mask layer 420 including the amorphous carbon layer (ACL) may be formed on the target layer 300, the cleavage relief layer 430 filling the cleavages 420C caused in the hard mask layer 420 may be formed to include a spin-on carbon (SOC) layer. After removing some portions of the target layer 300 using the hard mask patterns 450P including the hard mask layer patterns 420P and the cleavage relief layer patterns 430P as an etch mask, the hard mask layer patterns 420P and the cleavage relief layer patterns 430P may be removed together without leaving unwanted residue.

The inventive concept has been disclosed in conjunction with some embodiments as described above. Those skilled in the art will appreciate that various modifications, additions and substitutions are possible. Accordingly, the embodiments disclosed in the present specification should be considered from not a restrictive standpoint but an illustrative standpoint. The scope of the inventive concept is not limited to the above descriptions but defined by the accompanying claims, and includes equivalents thereof.

What is claimed is:

1. A method of forming patterns, the method comprising:
   forming a hard mask layer on a target layer that includes a step difference portion, wherein the step difference portion causes cleavages in the hard mask layer;
   coating a cleavage relief layer on the hard mask layer to fill the cleavages generated in the hard mask layer;
   forming photoresist patterns on the cleavage relief layer;
   removing portions of the cleavage relief layer and portions of the hard mask layer using the photoresist patterns as a first etch mask to form hard mask patterns;
   removing portions of the target layer using the hard mask patterns as a second etch mask to form target layer patterns; and
   removing the hard mask patterns.

2. The method of claim 1, wherein the cleavage relief layer includes a spin-on carbon (SOC) layer.

3. The method of claim 1, wherein the hard mask layer includes an amorphous carbon layer (ACL).

4. The method of claim 1, wherein the cleavage relief layer is formed to have a thickness thinner than that of the hard mask layer, and
   wherein the hard mask layer has a thickness on the step difference portion thinner than other portions of the hard mask layer.

5. The method of claim 1, further comprising forming an upper layer that covers the cleavage relief layer, includes a different material from that of the cleavage relief layer, and is disposed between the photoresist patterns and the cleavage relief layer.

6. The method of claim 5, wherein the upper layer includes silicon oxynitride (SiON) layer.

7. The method of claim 1, wherein forming the photoresist patterns includes:
   forming a photoresist layer on the cleavage relief layer;
   exposing portions of the photoresist layer using extreme ultraviolet (EUV); and
   developing the exposed portions of the photoresist layer.

8. The method of claim 1, wherein the target layer includes tungsten (W) layer.

9. The method of claim 1, further comprising forming a lower layer including a different material from that of the hard mask layer and being disposed between the target layer and the hard mask layer.

10. The method of claim 9, wherein the lower layer includes silicon nitride layer.

11. The method of claim 1, further comprising:
forming a lower structure layer that provides an alignment key; and
forming the target layer on the lower structure layer,
wherein the step difference portion of the target layer is generated by the alignment key.

12. A method of forming patterns, the method comprising:
forming a lower structure layer that provides an alignment key;
forming a target layer on the lower structure layer, the target layer including a step difference portion generated by the alignment key;
forming a hard mask layer including an amorphous carbon layer (ACL) on the target layer, wherein the step difference portion of the target layer causes cleavages in the hard mask layer;
forming a cleavage relief layer including a spin-on carbon (SOC) layer on the hard mask layer, the cleavage relief layer being formed to fill the cleavages caused in the hard mask layer by the step difference portion;
forming photoresist patterns on the cleavage relief layer;
removing portions of the cleavage relief layer and portions of the hard mask layer using the photoresist patterns as a first etch mask to form hard mask patterns;
removing portions of the target layer by using the hard mask patterns as a second etch mask to form target layer patterns; and
removing the hard mask patterns.

13. The method of claim 12, wherein forming the photoresist patterns includes:
forming a photoresist layer on the cleavage relief layer; and
exposing and developing the photoresist layer so that the photoresist patterns are aligned with positions of the target layer patterns using the alignment key.

14. The method of claim 13, wherein exposing the photoresist layer is performed using extreme ultraviolet (EUV).

15. The method of claim 13, wherein the cleavage relief layer is formed to have a thickness thinner than that of the hard mask layer.

16. The method of claim 13, further comprising forming an upper layer that covers the cleavage relief layer, includes a different material from the cleavage relief layer, and is disposed between the photoresist patterns and the cleavage relief layer.

17. The method of claim 16, wherein the upper layer includes silicon oxynitride (SiON) layer.

18. A method of forming patterns, the method comprising:
depositing a hard mask layer on a target layer that includes a step difference portion, wherein the step difference portion causes cleavages in the hard mask layer, the hard mask layer including an amorphous carbon layer (ACL);
forming a cleavage relief layer including a spin-on carbon (SOC) layer to fill the cleavages generated in the hard mask layer;
removing portions of the target layer using the hard mask layer and the cleavage relief layer; and
removing the hard mask layer and the cleavage relief layer together.

19. The method of claim 18, further comprising removing portions of the cleavage relief layer and portions of the hard mask layer to form hard mask patterns,
wherein the portions of the target layer are removed using the hard mask patterns as an etch mask, and
wherein the cleavage relief layer is formed to have a thickness thinner than that of the hard mask layer.

20. The method of claim 18, further comprising forming an upper layer including a silicon oxynitride (SiON) layer and being disposed on the cleavage relief layer.

* * * * *